United States Patent
Cheng et al.

(10) Patent No.: US 12,218,021 B2
(45) Date of Patent: *Feb. 4, 2025

(54) SEMICONDUCTOR PACKAGES AND METHODS OF FORMING THE SAME

(71) Applicant: Taiwan Semiconductor Manufacturing Company, Ltd., Hsinchu (TW)

(72) Inventors: Jung-Wei Cheng, Hsinchu (TW); Jiun-Yi Wu, Taoyuan (TW); Hsin-Yu Pan, Taipei (TW); Tsung-Ding Wang, Tainan (TW); Yu-Min Liang, Taoyuan (TW); Wei-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/327,030

(22) Filed: May 31, 2023

(65) Prior Publication Data

US 2023/0307305 A1    Sep. 28, 2023

Related U.S. Application Data

(63) Continuation of application No. 16/933,910, filed on Jul. 20, 2020, now Pat. No. 11,705,378.

(51) Int. Cl.
*H01L 23/40* (2006.01)
*H01L 23/31* (2006.01)
*H01L 23/538* (2006.01)

(52) U.S. Cl.
CPC ...... *H01L 23/3135* (2013.01); *H01L 23/4012* (2013.01); *H01L 23/5383* (2013.01)

(58) Field of Classification Search
CPC .................... H01L 23/3135; H01L 23/5383
See application file for complete search history.

(56) References Cited

U.S. PATENT DOCUMENTS

| | | | | |
|---|---|---|---|---|
| 7,557,440 | B2* | 7/2009 | Yamamoto | H01G 4/236 257/700 |
| 11,616,026 | B2* | 3/2023 | Wu | H01L 23/562 257/668 |
| 11,705,378 | B2* | 7/2023 | Cheng | H01L 23/5386 257/686 |
| 11,756,945 | B2* | 9/2023 | Wu | H01L 24/17 257/668 |
| 2022/0013463 | A1* | 1/2022 | Wu | H01L 23/49894 |
| 2023/0290731 | A1* | 9/2023 | Pan | H01L 23/293 |
| 2023/0369194 | A1* | 11/2023 | Hsu | H01L 21/568 |

* cited by examiner

*Primary Examiner* — Eugene Lee
(74) *Attorney, Agent, or Firm* — JCIPRNET

(57) ABSTRACT

A semiconductor package includes a circuit board structure, a first redistribution layer structure and first bonding elements. The circuit board structure includes outermost first conductive patterns and a first mask layer adjacent to the outermost first conductive patterns. The first redistribution layer structure is disposed over the circuit board structure. The first bonding elements are disposed between and electrically connected to the first redistribution layer structure and the outermost first conductive patterns of the circuit board structure. In some embodiments, at least one of the first bonding elements covers a top and a sidewall of the corresponding outermost first conductive pattern.

20 Claims, 14 Drawing Sheets

SEMICONDUCTOR PACKAGES AND METHODS OF FORMING THE SAME

CROSS-REFERENCE TO RELATED APPLICATION

This application is a continuation application of and claims the priority benefit of a prior application Ser. No. 16/933,910, filed on Jul. 20, 2020. The entirety of the above-mentioned patent application is hereby incorporated by reference herein and made a part of this specification.

BACKGROUND

Semiconductor packages are used in a variety of electronic applications, such as personal computers, cell phones, digital cameras, and other electronic equipment. In terms of the packaging used for integrated circuit components or semiconductor dies, one or more chip packages are generally bonded to a circuit carrier (e.g., a system board, a printed circuit board, or the like) for electrical connections to other external devices or electronic components. Although the existing semiconductor package has been generally adequate for their intended purposes, it has not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
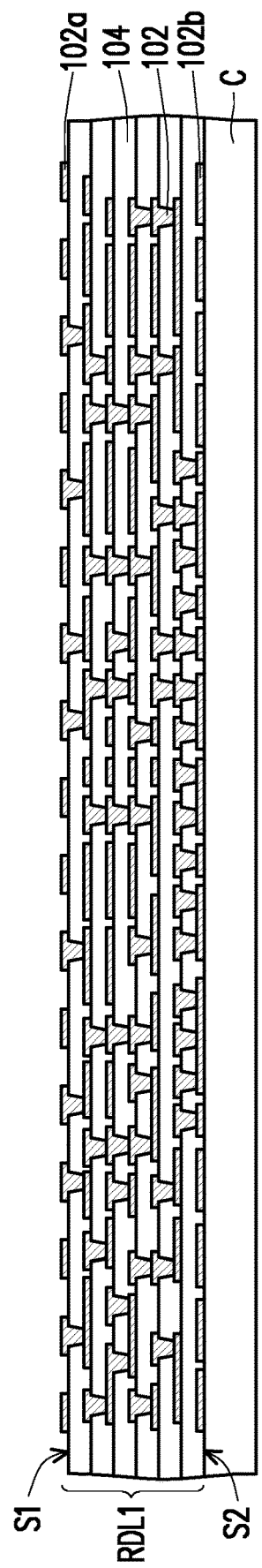
FIGS. 1A to 1G are schematic cross-sectional views of a method of forming a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

FIGS. 1A to 1G are schematic cross-sectional views of a method of forming a semiconductor package in accordance with some embodiments. It is understood that the disclosure is not limited by the method described below. Additional operations can be provided before, during, and/or after the method and some of the operations described below can be replaced or eliminated, for additional embodiments of the methods.

Referring to FIG. 1A, a redistribution layer structure RDL1 is formed over a carrier C. In some embodiments, the carrier C may be a glass carrier or a suitable carrier for carrying a semiconductor wafer or a reconstituted wafer for the manufacturing method of a semiconductor package. The shape of the carrier C may be circle, rectangle or other suitable shape. In some embodiments, the carrier C has a debonding layer (not shown) formed thereon. In some embodiments, the debonding layer includes an Ultra-Violet (UV) glue, a Light-to-Heat Conversion (LTHC) glue, or the like, although other types of adhesives may be used. The debonding layer is decomposable under the heat of light to thereby release the carrier C from the structure formed thereon.

In some embodiments, the redistribution layer structure RDL1 is a fan-out redistribution layer structure. In some embodiments, the redistribution layer structure RDL1 includes conductive patterns 102/102a/102b and polymer layers 104. The conductive patterns 102/102a/102b are disposed in the polymer layers 104 and electrically connected to each other. In some embodiments, the redistribution layer structure RDL1 has a first side S1 (e.g., front side) and a second side S2 (e.g., backside) opposite to the first side S1. In some embodiments, the conductive patterns 102a are the outermost conductive patterns exposed by the first side S1 of the redistribution layer structure RDL1, and the conductive patterns 102b are the outermost conductive patterns exposed by the second side S2 of the redistribution layer structure RDL1. In some embodiments, the outermost conductive patterns 102a, 102b include bonding pads, bonding vias, bonding pillars and/or under-ball metallurgy (UBM) patterns for ball mount. In some embodiments, each polymer layer 104 includes polybenzoxazole (PBO), polyimide (PI), benzocyclobutene (BCB), the like, or a combination thereof. The polymer layers 104 may be replaced by dielectric layers or insulating layers as needed. In some embodiments, the conductive patterns 102/102a/102b include metal vias, metal lines and/or metal pads. The metal vias may be formed between and in contact with two metal lines. Each of the conductive patterns 102/102a/102b may include tungsten (W), copper (Cu), a copper alloy, aluminum (Al), an aluminum alloy or a combination thereof. In some embodiments, a barrier layer (not shown) is formed between each conductive pattern 102 and the adjacent polymer layer 104 to prevent the material of the conductive pattern 102 from migrating to the neighboring device. The barrier layer may include Ta, TaN, Ti, TiN, CoW or a combination thereof. In some embodiments, a seed layer (not shown) is further formed between each conductive pattern 102 and the barrier layer. The seed layer may include Cu, Ag or the like. In some embodiments, the redistribution layer structure RDL1 further includes an etching stop layer (not shown) between two adjacent conductive patterns and/or two adjacent polymer layers. The etching stop layer may include SIN, SiC, SiCN, AlN, $Al_2O_3$ or a combination thereof. In some embodiments, the redistribution layer structure RDL1 is formed by multiple electroplating processes, multiple damascene processes, or the like.

Figure 1B:
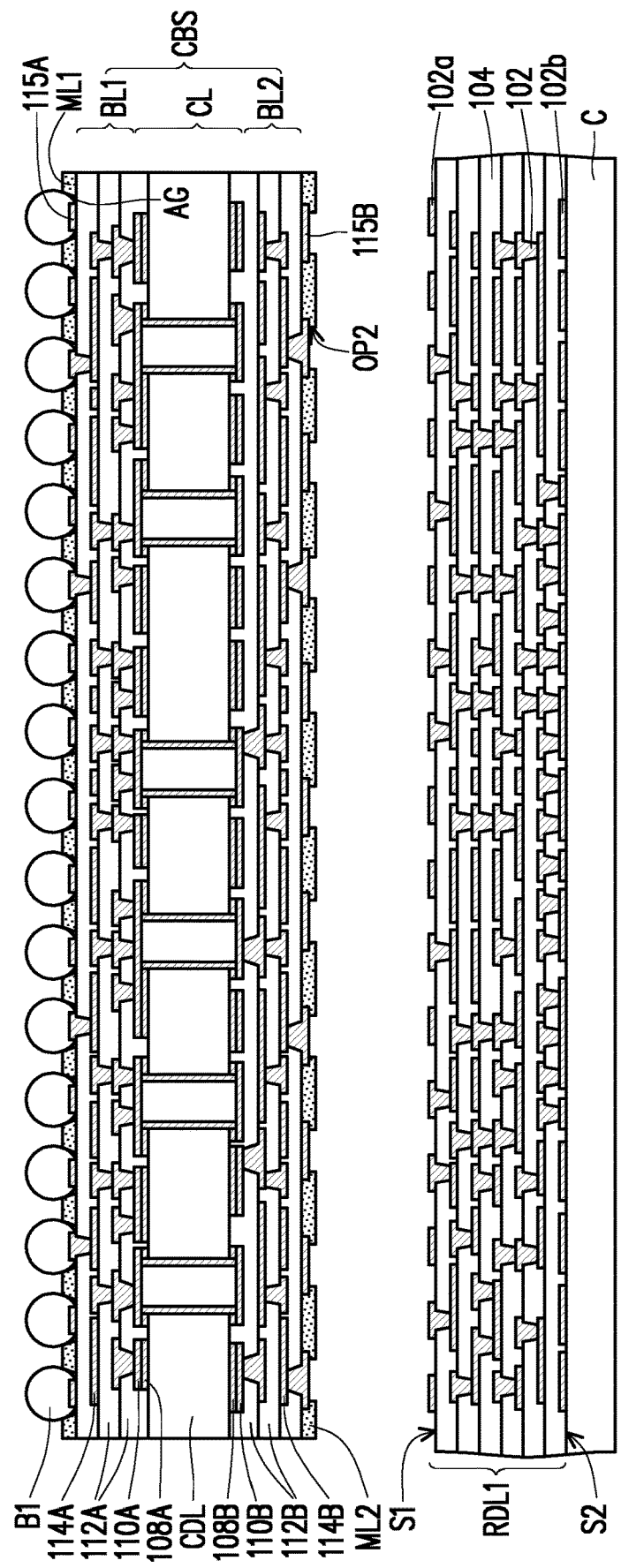

Referring to FIG. 1B, at least one circuit board structure CBS is provided. In some embodiments, although only one circuit board structure CBS is shown in FIG. 1B, multiple circuit board structures CBS may be bonded onto the redistribution layer structure RDL1 respectively. Specifically, the redistribution layer structure RDL1 may include multiple package regions, and the circuit board structures CBS are respectively bonded to the package regions. In some embodiments, the circuit board structure CBS includes a core layer CL and first and second build-up layers BL1, BL2 respectively located on two surfaces of the core layer CL. In some embodiments, the core layer CL includes a core dielectric layer CDL, core conductive layers 108A and 108B, conductive lids 110A and 110B, and plated through holes TH. In some embodiments, the core dielectric layer CDL includes prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, the like, or a combination thereof. However, the disclosure is not limited thereto, and other dielectric materials may also be used. The core dielectric layer CDL may be formed by a lamination process, a coating process, or the like. The core conductive layers 108A and 108B are formed on the opposite sides of the core dielectric layer CDL. In some embodiments, the core conductive layers 108A and 108B include copper, gold, tungsten, aluminum, silver, gold, the like, or a combination thereof. The conductive lids 110A and 110B are located respectively over the core conductive layers 108A and 108B. In some embodiments, the conductive lids 110A and 110B include copper or other suitable conductive material. In some embodiments, the plated through holes TH are disposed in and penetrate through the core dielectric layer CDL, which provide electrical connection between the core conductive layer 108A and the core conductive layer 108B. In other words, the plated through holes TH provide electrical paths between the electrical circuits located on two opposite sides of the core dielectric layer CDL. In some embodiments, the plated through holes TH may be filled with a conductive material such as copper. In some embodiments, the plated through holes TH may be lined with a conductive material and filled up with an insulating material.

In some embodiments, the first and second build-up layers BL1 and BL2 are respectively disposed on the opposite sides of the core layer CL. Specifically, the first build-up layer BL1 is formed over the conductive lid 110A of the core layer CL, and the second build-up layer BL2 is formed over the conductive lid 110B of the core layer CL. In some embodiment, the formation of the first build-up layer BL1 may include forming first dielectric layers 112A and first conductive patterns 114A/115A alternately stacked over the first surface of the core layer CL. Similarly, the formation of the second build-up layer BL2 may include forming second dielectric layers 112B and second conductive patterns 114B/115B alternately stacked over the second surface of the core layer CL. Specifically, the first conductive patterns 115A are the outermost first conductive patterns of the first build-up layer BL1, and the second conductive patterns 115B are the outermost second conductive patterns of the second build-up layer BL2. Although only three layers of conductive patterns and three layers of dielectric layers are illustrated for each of the first and second build-up layers BL1 and BL2, the scope of the disclosure is not limited thereto.

In some embodiments, each of the first and second dielectric layers 112A and 112B includes prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), the like, or a combination thereof. In some embodiments, the core dielectric layer CDL and the first and second dielectric layers 112A, 112B are made by the same material. In some embodiments, each of the first and second dielectric layers 112A and 112B may be patterned using a photolithography and etching process. In some embodiments, each of the first and second dielectric layers 112A and 112B may be patterned by a film lamination followed by a laser drilling process. In some embodiments, each of the first conductive patterns 114A/115A and the second conductive patterns 114B/115B includes metal, such as aluminum, titanium, copper, nickel, tungsten, and/or alloys thereof. In some embodiments, each of the first conductive patterns 114A/115A and the second conductive patterns 114B/115B may be formed by a deposition followed by a photolithography and etching process. In some embodiments, each of the first conductive patterns 114A/115A and the second conductive patterns 114B/115B may be formed by an electroplating or an electroless plating. In some embodiments, the number of layers in the first build-up layer BL1 is equal to the number of layers in the second build-up layer BL2. In other embodiments, the number of layers in the first build-up layer BL1 is different from the number of layers in the second build-up layer BL2.

Continue referring to FIG. 1B, a first mask layer ML1 is formed over the first build-up layer BL1, and a second mask layer ML2 is formed over the second build-up layer BL2. In some embodiments, the first and second mask layers ML1 and ML2 may be formed of a material having a chemical composition of silica, barium sulfate and epoxy resin, and/or the like. The first and second mask layers ML1 and ML2 are referred to as solder masks (SM) or solder resists (SR) in some examples. The first and second mask layers ML1 and ML2 are configured to prevent short, corrosion or contamination of the circuit pattern and protect the circuit of the printed circuit board from external impacts and chemicals.

Figure 2:
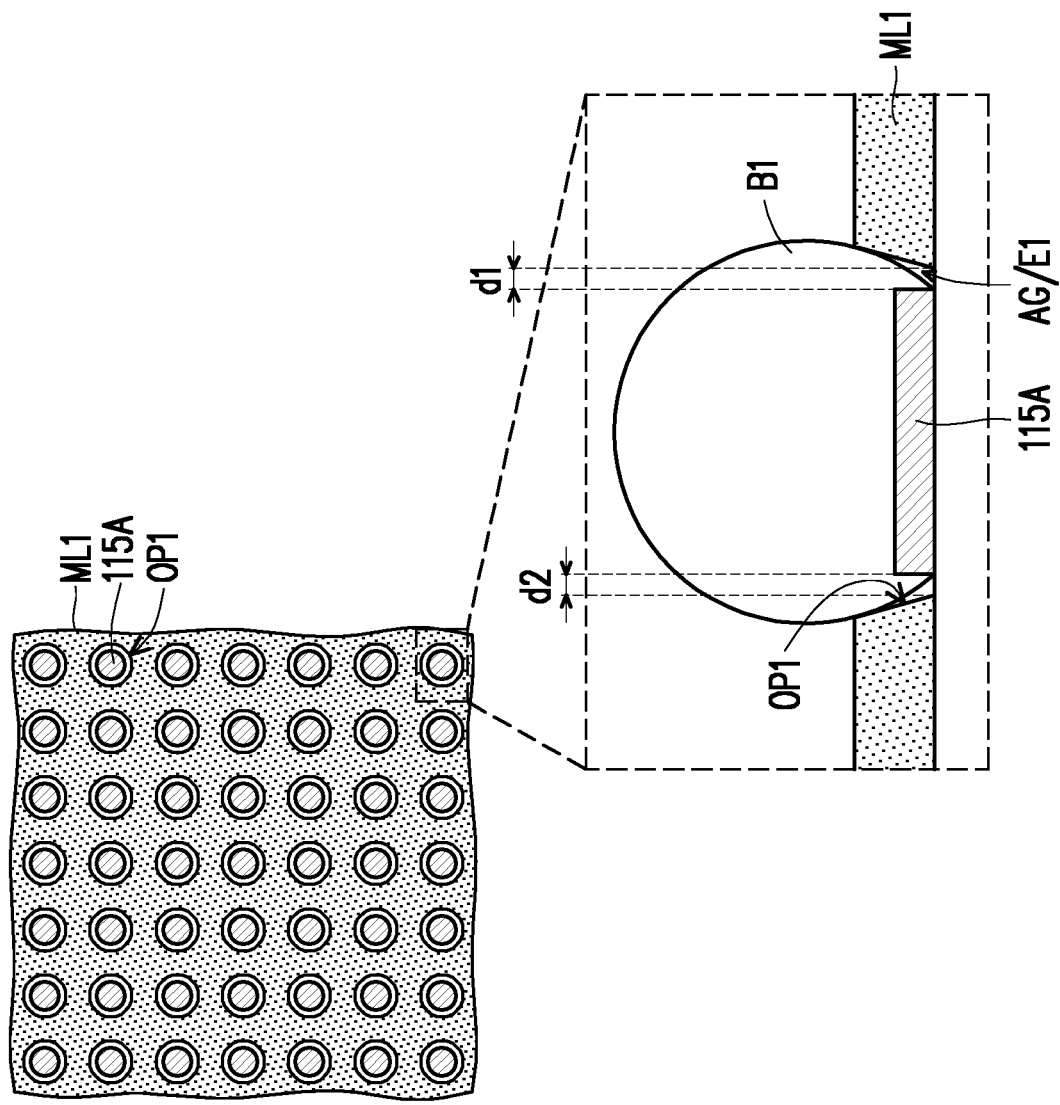
FIGS. 2 to 7 illustrate simplified top views and localized cross-sectional views of various semiconductor packages in accordance with some embodiments.

In some embodiments, the first mask layer ML1 includes opening patterns OP1 (as shown in FIG. 2) that correspond to the positions of subsequently formed bonding elements B1. In some embodiments, the opening patterns OP1 of the first mask layer ML1 expose the outermost first conductive patterns 115A of the first build-up layer BL1. Specifically, the opening patterns OP1 of the first mask layer ML1 expose the tops and sidewalls of the outermost first conductive patterns 115A of the first build-up layer BL1. From a top view of FIG. 2, the opening patterns OP1 of the first mask layer ML1 are disposed around and spaced or separated from the outermost first conductive patterns 115A, respectively. In some embodiments, each of the opening patterns OP1 of the first mask layer ML1 has an inclined sidewall. In other embodiments, each of the opening patterns OP1 of the first mask layer ML1 has a substantially vertical sidewall.

Figure 1C:
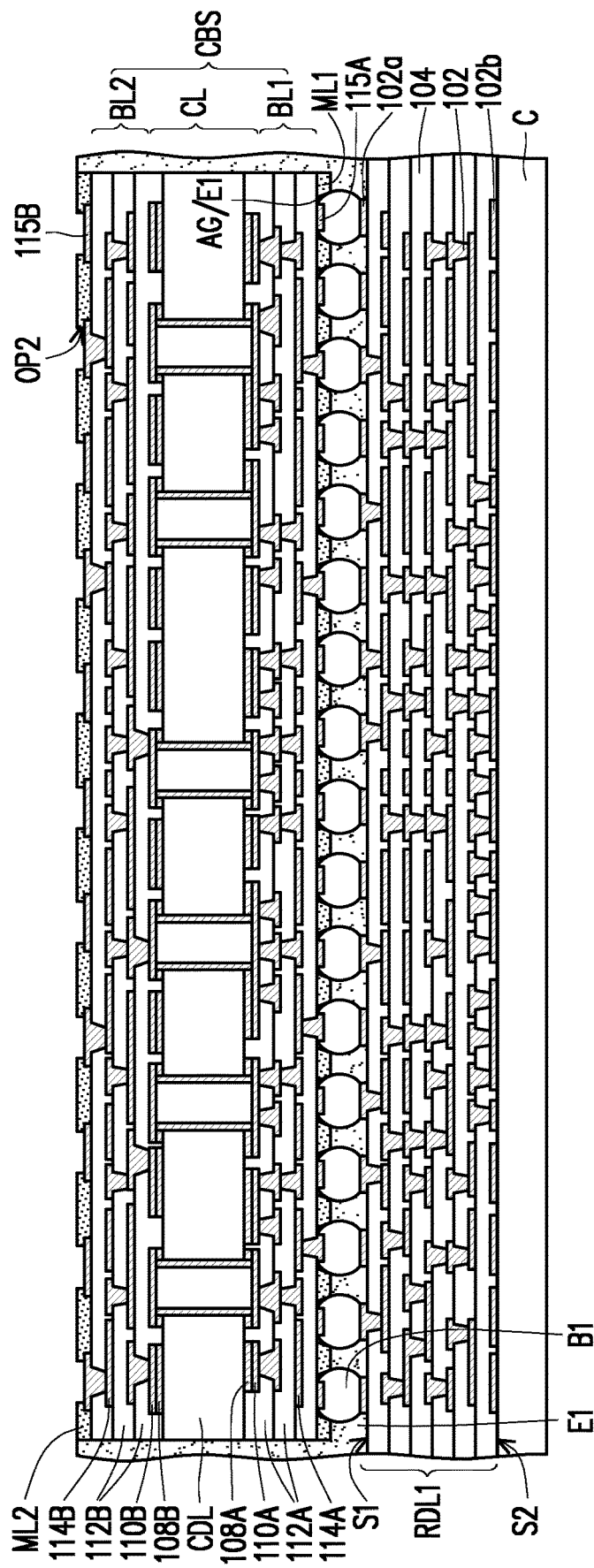
Figure 1D:
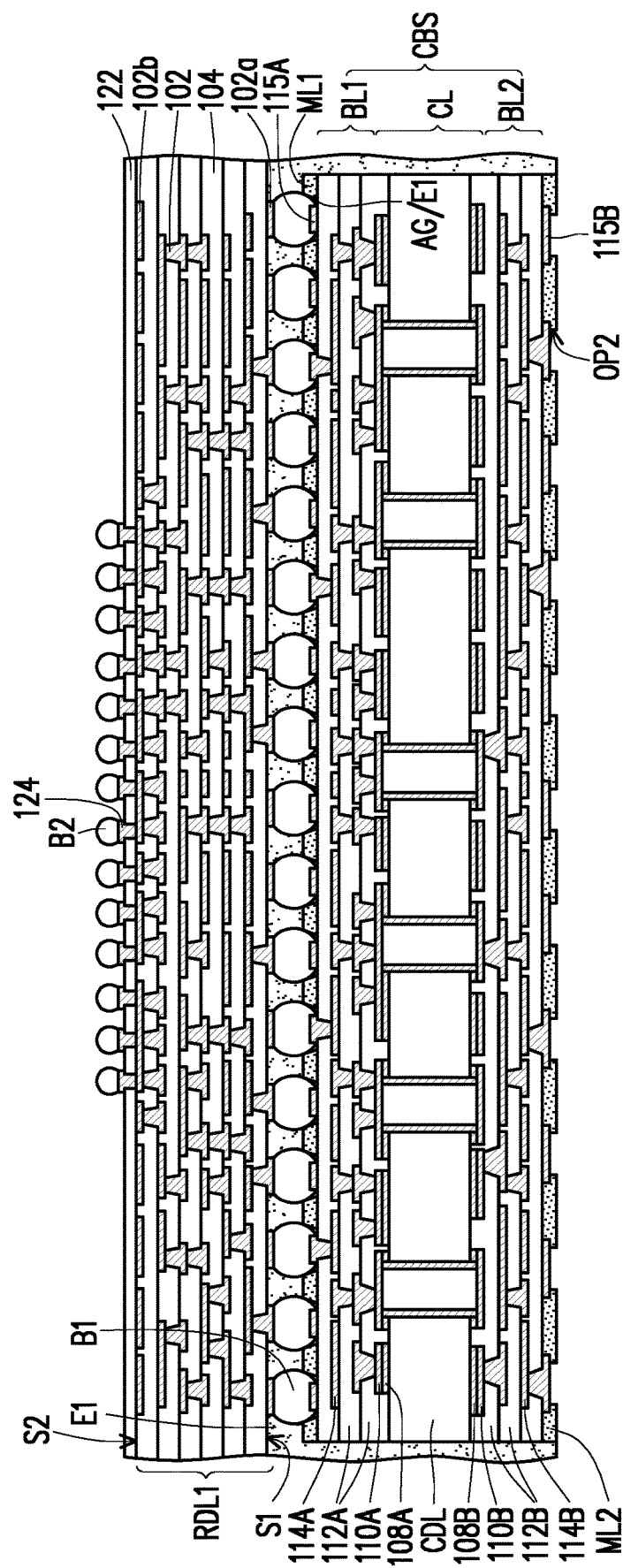
Figure 1E:
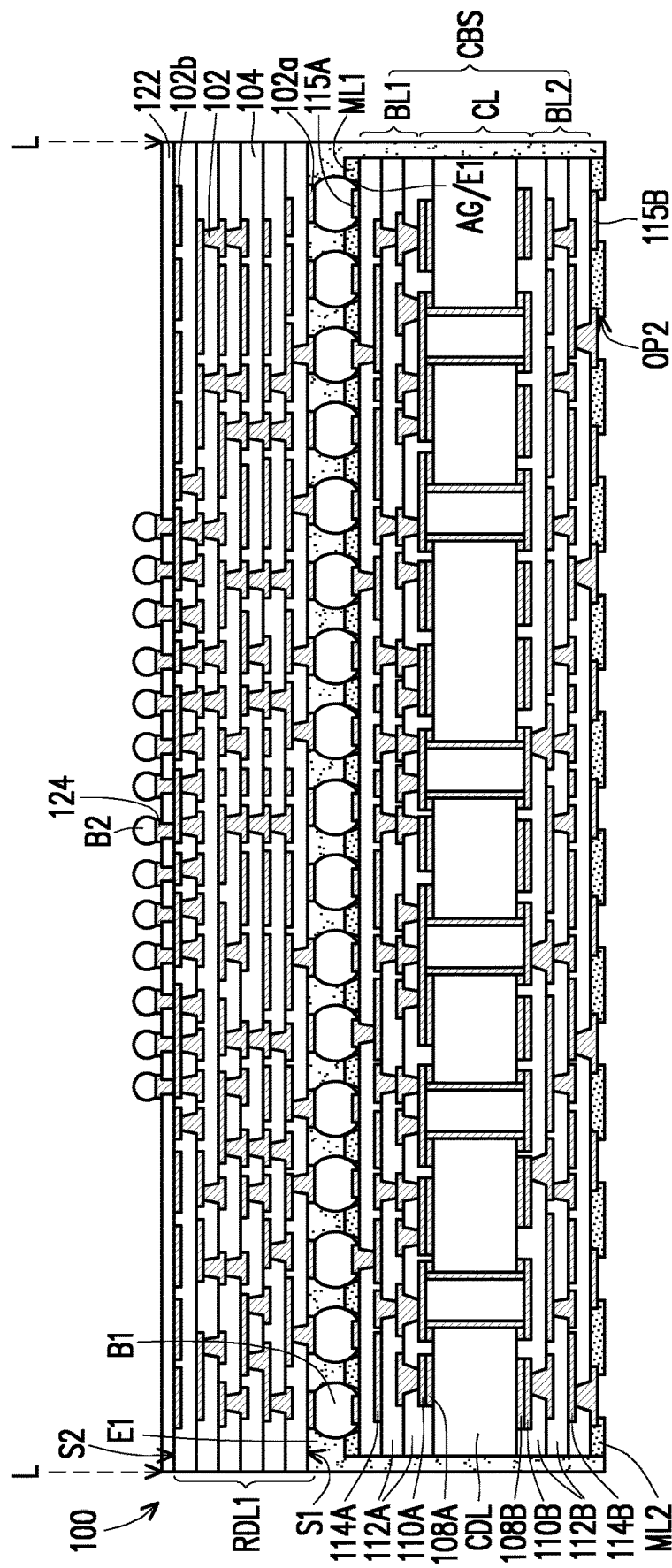
Figure 1F:
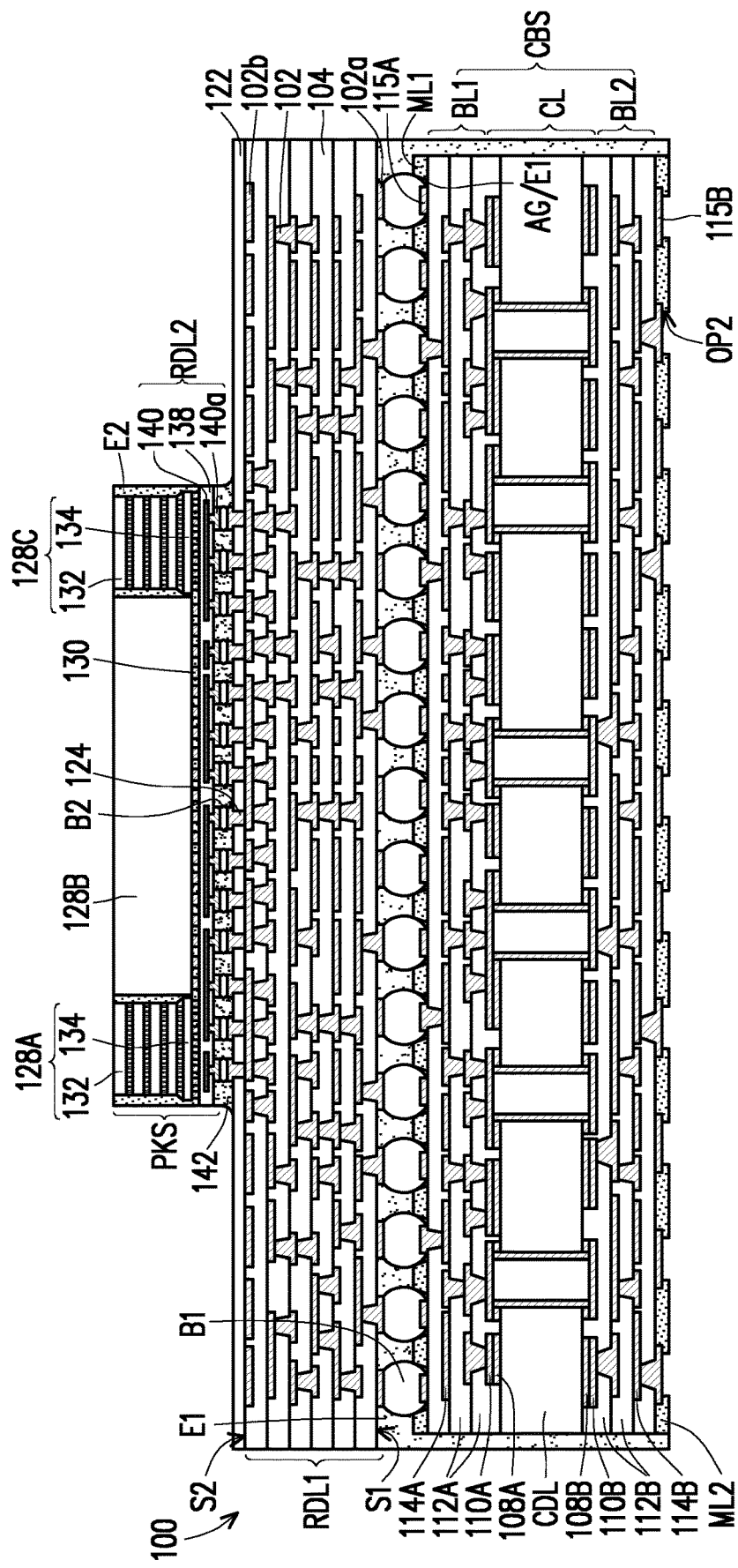
Figure 1G:
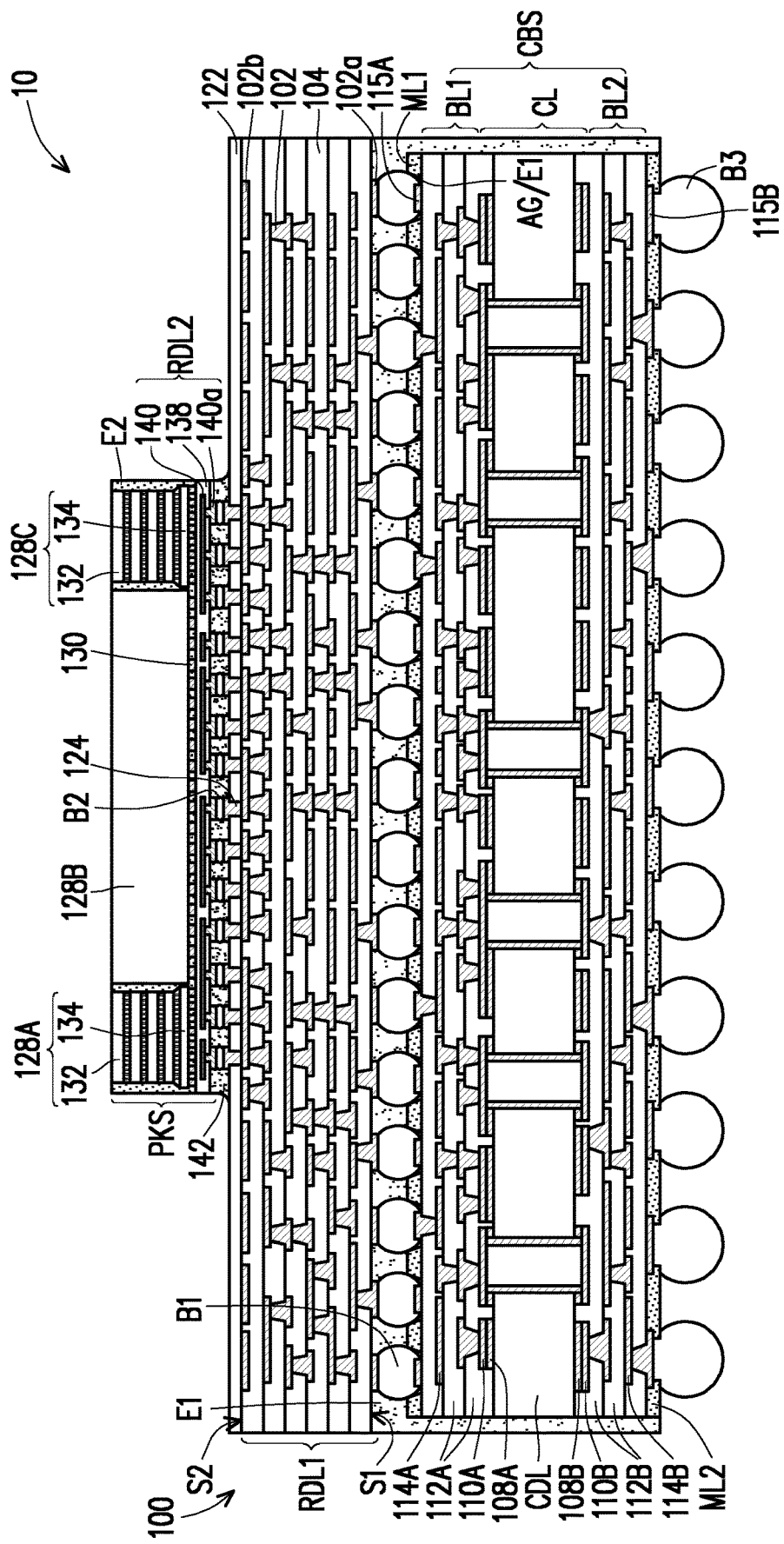

In some embodiments, the second mask layer ML2 includes opening patterns OP2 that correspond to the positions of subsequently formed bonding elements B3 (as shown in FIG. 1G). In other embodiments, the second mask layer ML2 covers the outermost second conductive patterns 115B of the second build-up layer BL2 at this stage and will be patterned in the final stage of FIG. 1G.

Thereafter, bonding elements B1 are formed in the opening patterns OP1 of the first mask layer ML1 over the first build-up layer BL1. In some embodiments, the bonding elements B1 include solder bumps, and/or may include metal pillars (e.g., copper pillars), solder caps formed on metal pillars, and/or the like. The bonding elements B1 may be formed by a suitable process such as an evaporation, an electroplating, a ball drop, or a screen printing. In some embodiments, the bonding elements B1 are formed by a mounting process and a reflow process. In some embodiments, the pitch of the bonding elements B1 ranges from about 300 μm to 500 μm, and the dimension (e.g., width) of the bonding elements B1 ranges from about 250 μm to 400 μm. At this stage, the circuit board structure CBS may be also called a semi-finished circuit substrate or a semi-finished circuit carrier in some examples.

In the disclosure, each of the outermost first conductive patterns 115A is separated from the corresponding opening pattern OP1 of the first mask layer ML1, such that the subsequently formed bonding element B1 flows to cover the top and the sidewall of the outermost first conductive pattern 115A. By such configuration, the solder joint area is greatly increased, the bonding stress is significantly reduced, and solder crack defects caused by high stress (specifically in corner and/or edge package regions) are not found. In some embodiments, an air gap AG is present between at least one of the opening patterns OP1 of the first mask layer ML1 and the adjacent bonding element B1. In other embodiments, no air gap is present between at least one of the opening patterns OP1 of the first mask layer ML1 and the adjacent bonding element B1. For example, the solder of the bonding element B1 fills the space between each of the outermost first conductive patterns 115A and the adjacent first mask layer ML1.

Referring to FIG. 1C, the circuit board structure CBS is turned over, such that the first mask layer ML1 of the circuit board structure CBS faces the first side S1 of the redistribution layer structure RDL1. In some embodiments, the circuit board structure CBS is bonded to the outermost conductive patterns 102a of the redistribution layer structure RDL1 through the bonding elements B1. Specifically, the bonding elements B1 are in physical contact with the outermost first conductive pattern 115A of the circuit board structure CBS and the outermost conductive patterns 102a of the redistribution layer structure RDL1. In some embodiments, the dimension of the outermost conductive patterns 102a is similar to the dimension of the outermost first conductive pattern 115A, so as to provide similar stress from both sides. However, the disclosure is not limited thereto. The dimension of the outermost conductive patterns 102a may be different from the dimension of the outermost first conductive pattern 115A upon the design requirements.

Thereafter, an encapsulation layer E1 is formed to encapsulate or surround the sidewall of the circuit board structure CBS and fill the space between the circuit board structure CBS and the redistribution layer structure RDL1. In some embodiments, the encapsulation layer E1 includes a molding compound, a dielectric encapsulation material, a resin or the like, such as epoxy. In some embodiments, the encapsulation layer E1 includes a polymer material such as polybenzoxazole (PBO), polyimide, benzocyclobutene (BCB), the like, or a combination thereof. In some embodiments, the encapsulation layer E1 is formed by a molding process. A molding material may be dispensed or injected from one side of the structure (e.g., the side close to the outermost bonding elements B1), and the molding material is then drawn by capillary action and therefore fills the space between the circuit board structure CBS and the redistribution layer structure RDL. In some embodiments, the encapsulation layer E1 surrounds the bonding elements B1 and completely fills in the air gaps AG between the opening patterns OP1 of the first mask layer ML1 and the bonding elements B1. In some embodiments, some of air gaps AG may be still filled with air instead of the encapsulation layer E1.

Referring to FIG. 1D, the carrier C is released from the overlying structure. In some embodiments, the debonding layer is decomposed under heat of light, and the carrier C is then released from the second side S2 of the redistribution layer structure RDL. Specifically, the redistribution layer structure RDL1 with the circuit board structure CBS thereover is de-bonded from the carrier C and is turned upside down.

Thereafter, bonding elements B2 are formed over the second side S2 of the redistribution layer structure RDL1. In some embodiments, before forming the bonding elements B2, a dielectric layer 122 is formed on the redistribution layer structure RDL1, and conductive patterns 124 are formed in the dielectric layer 122 to electrically connect the redistribution layer structure RDL1. In some embodiments, the dielectric layer 122 is formed to expose the outermost conductive patterns 102b of the redistribution layer structure RDL1 at the second side S2 thereof. In some embodiments, the dielectric layer 122 includes polymer such as polyimide, polybenzoxazole (PBO) or benzocyclobutene (BCB), nitride such as silicon nitride, oxide such as silicon oxide, phosphosilicate glass (PSG), borosilicate glass (BSG), boron-doped phosphosilicate glass (BPSG), the like, or a combination thereof. In some embodiments, the dielectric layer 122 may be formed by a suitable fabrication technique such as spin-on coating, chemical vapor deposition (CVD), plasma-enhanced chemical vapor deposition (PECVD) or the like. In some embodiments, the material of the dielectric layer 122 may be different from the material of the outermost dielectric layer 104 of the redistribution layer structure RDL1. In an exemplary embodiment, the outermost dielectric layer 104 may be made of molding compound, and the dielectric layer 122 may be made of polymer such as polyimide. However, the disclosure is not limited thereto. In other embodiments, the dielectric layer 122 and the outermost dielectric layer 104 of the redistribution layer structure RDL1 are made by the same material. In some embodiments, the conductive patterns 124 include bonding pads, bonding vias, bonding pillars and/or under-ball metallurgy (UBM) patterns for ball mount. In some embodiments, the dielectric layer 122 and the conductive patterns 124 are regarded as part of the redistribution layer structure RDL1.

After forming the conductive patterns 124 in the dielectric layer 122, the bonding elements B2 are formed on and electrically connected to the conductive patterns 124. In some embodiments, the bonding elements B2 include solder bumps, and/or may include metal pillars (e.g., copper pillars), solder caps formed on metal pillars, and/or the like. The bonding elements B2 are referred to as micro-bumps in some examples. In some examples, the pitch of the bonding elements B2 is about 50 μm or less, and the dimension (e.g., width) of the bonding elements B2 ranges from about 15 μm to 35 μm. The bonding elements B2 are referred to as controlled collapse chip connection (C4) bumps in other examples. In other examples, the pitch of the bonding elements B2 ranges from about 50 μm to 200 μm, and the dimension (e.g., width) of the bonding elements B2 ranges from about 35 μm to 110 μm. The bonding elements B2 are arranged in a regular or irregular array. In some embodiments, the bonding elements B2 have the same dimension. In other embodiments, the bonding elements B2 have the same dimensions.

The bonding elements B2 are electrically connected to the redistribution layer structure RDL1 through the conductive patterns 124. In some embodiments, the bonding elements B2 may be formed by a mounting process and a reflow process. In some embodiments, the dimension of the bonding elements B2 is smaller than the dimension of the bonding elements B1. Upon the formation of the conductive patterns 124 and the bonding elements B2, the outermost second conductive patterns 115B of the circuit board structure CBS may be protected from being damaged.

Referring to FIG. 1E, a dicing process is performed to the structure of FIG. 1D along cutting lines L, so as to cut through the redistribution layer structure RDL1 and the encapsulation layer E1. After the dicing process or singulation process, the adjacent integrated substrates 100 (or circuit board structures CBS) are separated from each other. In some embodiments, the edge of the redistribution layer structure RDL1 is flush with the edge of the encapsulation layer E1. In some embodiments, the dicing process is a wafer dicing process including a mechanical blade sawing or a laser cutting. In some embodiments, each integrated substrate 100 includes a circuit board structure CBS (i.e., a semi-finished circuit substrate), a redistribution layer structure (i.e., the redistribution layer structure RDL1, the dielectric layer 122 and the conductive patterns 124) over the circuit board structure CBS, and bonding elements B1, B2 on opposite surfaces of the redistribution layer structure. In some embodiments, the integrated substrate 100 has a high modulus such as in a range of 15 GPa to 50 GPa, for example.

Referring to FIG. 1F, a package structure PKS is bonded to the integrated substrate 100 through the bonding elements B2. In some embodiments, the package structure PKS includes System-On-Chip (SoC) packages, Chip-On-Wafer (CoW) packages, Integrated-Fan-Out (InFO) packages, Chip-On-Wafer-On-Substrate (CoWoS) packages, other three-dimensional integrated circuit (3DIC) packages, and/or the like. In some embodiments, the semiconductor package PKS includes a redistribution layer structure RDL2, package components 128A, 128B, 128C over the redistribution layer structure RDL2 and an encapsulation layer E2 over the redistribution layer structure RDL2 and around the package components 128A, 128B, 128C.

In some embodiments, each of the package components 128A, 128B, 128C may be a package, a device die, a die stack, and/or the like. The device die may be high performance integrated circuit, such as a System-on-Chip (SoC) die, a Central Processing Unit (CPU) die, a Graphic Processing Unit (GPU) die, field-programmable gate array (FPGA) die, a mobile application die, a memory die, or a die stack. In some embodiments, the memory die may be in the form of memory cube such as High Bandwidth Memory (HBM) cube. The package components 128A, 128B, 128C may have respective semiconductor substrates (not shown) in respective dies. In some embodiments, the rear surfaces of the semiconductor substrates are surfaces that face upward in accordance to the orientation illustrated in FIG. 1F. The package components 128A, 128B, 128C further include integrated circuit devices (such as active devices include transistors, not shown) and connectors 130 over the integrated circuit devices at front surfaces (e.g., surfaces facing downward) of the respective semiconductor substrates. In some embodiments, the package components 128A, 128B, 128C have the same or different sizes and/or functions upon the design requirements. In one of the exemplary embodiments, the package components 128A, 128C may be memory cubes, and the package component 128B may be CPU, GPU, FPGA or other suitable high performance integrated circuit. In the exemplary embodiment, each of the package components 128A and 128C includes a die stack 132, and a controller 134 at the bottom of the die stack 132.

In some embodiments, the connectors 130 of the package components 128A, 128B, 128C are encapsulated in the encapsulation layer E2, as shown in FIG. 1F. In other embodiments, the connectors 130 may be disposed in a dielectric layer (not shown) which is then encapsulated by the encapsulation layer E2. In some embodiments, the redistribution layer structure RDL2 is disposed between and electrically connected to the redistribution layer structure RDL1 and each of the package components 128A, 128B, 128C. In some embodiments, the redistribution layer structure RDL2 is a fan-out redistribution layer structure. In some embodiments, the redistribution layer structure RDL2 includes polymer layers 138 and conductive patterns 140/140a. In some embodiments, the conductive patterns 140a are the outermost conductive patterns of redistribution layer structure RDL2. In some embodiments, the outermost conductive patterns 140a include bonding pads, bonding vias, bonding pillars and/or under-ball metallurgy (UBM) patterns for ball mount. In some embodiments, each polymer layer 138 includes polybenzoxazole (PBO), polyimide (PI), benzocyclobutene (BCB), the like, or a combination thereof. The polymer layers 138 may be replaced by dielectric layers or insulating layers as needed. In some embodiments, the conductive patterns 140/140a include metal vias, metal lines and/or metal pads. The metal vias may be formed between and in contact with two metal lines. Each conductive patterns 140/140a may include tungsten (W), copper (Cu), a copper alloy, aluminum (Al), an aluminum alloy or a combination thereof. In some embodiments, a barrier layer (not shown) is formed between each conductive pattern 140 and the adjacent polymer layer 138 to prevent the material of the conductive pattern 140 from migrating to the neighboring device. The barrier layer may include Ta, TaN, Ti, TIN, CoW or a combination thereof. In some embodiments, a seed layer (not shown) is further formed between each conductive pattern 140 and the barrier layer. The seed layer may include Cu, Ag or the like. In some embodiments, the redistribution layer structure RDL2 further includes an etching stop layer (not shown) between two adjacent conductive patterns and/or two adjacent polymer layers. The etching stop layer may include SIN, SiC, SiCN, AlN, $Al_2O_3$ or a combination thereof. In some embodiments, the redistribution layer structure RDL2 is formed by multiple electroplating processes, multiple damascene processes, or the like.

In some embodiments, after bonding, an underfill layer 142 is formed to fill the space between the second redistribution layer structure RDL2 and the first redistribution layer structure RDL1, and surrounds the bonding elements B2. In some embodiments, the second underfill layer 142 includes a molding compound such as epoxy, and is formed using dispensing, injecting, and/or spraying process. In some embodiments, the package structure PKS is pre-fabricated;

that is, the package components 128A, 128B, 128C are encapsulated by the encapsulation layer E2 before bonding to the integrated substrate 100. However, the disclosure is not limited thereto. In other embodiments, the package components 128A, 128B, 128C may be bonded to the integrated substrate 100, and then the encapsulation layer E2 is formed over the integrated substrate 100 to encapsulate the package components 128A, 128B, 128C.

Referring to FIG. 1G, after the package structure PKS is formed, bonding elements B3 are formed in the opening patterns OP2 of the second mask layer ML2 that expose the outermost second conductive patterns 115B of the second build-up layer BL2. The bonding elements B3 are electrically connected to the outermost second conductive patterns 115B in the second build-up layer BL2 of the circuit board structure CBS. In some embodiments, the bonding elements B3 include ball grid array (BGA) connectors, solder balls, metal pillars, and/or the like. In some embodiments, the bonding elements B3 are formed by a mounting process and a reflow process. In some embodiments, the pitch of the bonding elements B3 ranges from about 900 μm to 1000 μm, and the dimension (e.g., width) of the bonding elements B1 ranges from about 500 μm to 600 μm. In certain embodiments, the bonding elements B3 are available to be mounted onto additional electrical components (e.g., circuit carrier, system board, mother board, etc.). At this stage, the circuit board structure CBS may be also called a finished circuit substrate or a finished circuit carrier in some examples.

In some embodiments, the size of the bonding elements B3 of the circuit board structure CBS is different from (e.g., greater than) the size of the bonding elements B1 of the circuit board structure CBS. In some embodiments, the size of the bonding elements B1 is different from (e.g., greater than) the size of the bonding elements B2 of the package structure PKS.

At this point, a semiconductor package 10 of some embodiments is thus fabricated. In the disclosure, the widened opening pattern OP1 of the first mask layer ML1 is configured to increase the solder joint area and therefore reducing the bonding stress. The relationship between the opening pattern OP1 of the first mask layer ML1 and the adjacent elements is described below with reference to the cross-sectional view of FIG. 1G and the top-view of FIG. 2.

FIG. 2 illustrates a simplified top view and a localized cross-sectional view of a semiconductor packages in accordance with some embodiments. For simplicity and clarity of illustration, only few elements are shown in the top view of FIG. 2, and these elements are not necessarily in the same plane.

In some embodiments, the distance from an edge or sidewall of a first conductive pattern 115A to an edge or sidewall of the adjacent opening pattern OP1 of the first mask layer ML1 is marked as "d1", and the distance from an opposite edge or sidewall of the same first conductive pattern 115A to an opposite edge or sidewall of the adjacent opening pattern OP1 of the first mask layer ML1 is marked as "d2". In some embodiments, each of the horizontal separation distances d1 and d2 is about 5 μm, 10 μm or more. In some embodiments, the horizontal separation distance d1 is substantially equal to the horizontal separation distance d2. In other embodiments, the horizontal separation distance d1 is different from the horizontal separation distance d2.

FIG. 3 to FIG. 7 illustrate simplified top views and localized cross-sectional views of various semiconductor packages in accordance with some embodiments. For simplicity and clarity of illustration, only few elements are shown in the top views of FIG. 3 to FIG. 7, and these elements are not necessarily in the same plane.

Figure 3:
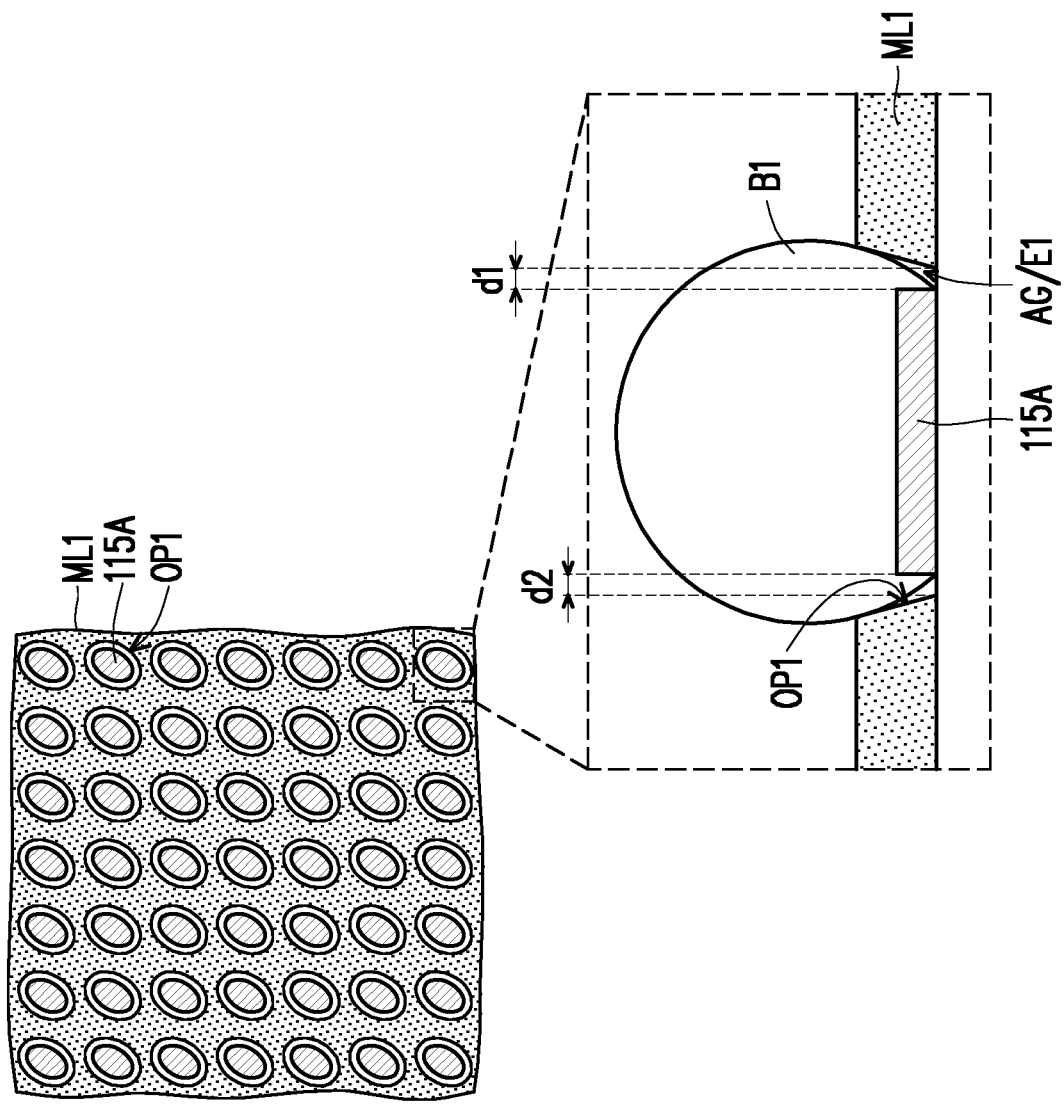
Figure 4:
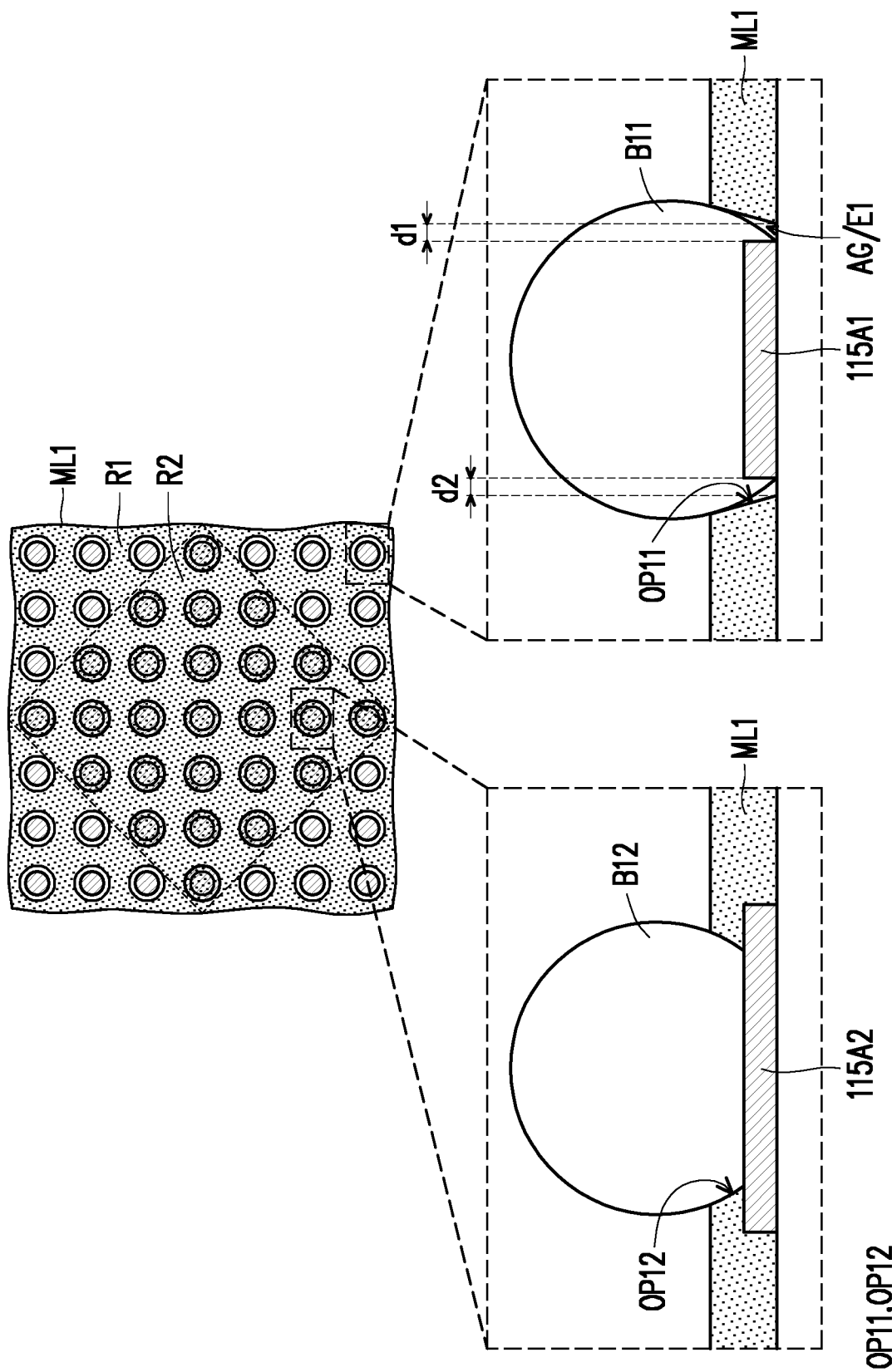
Figure 5:
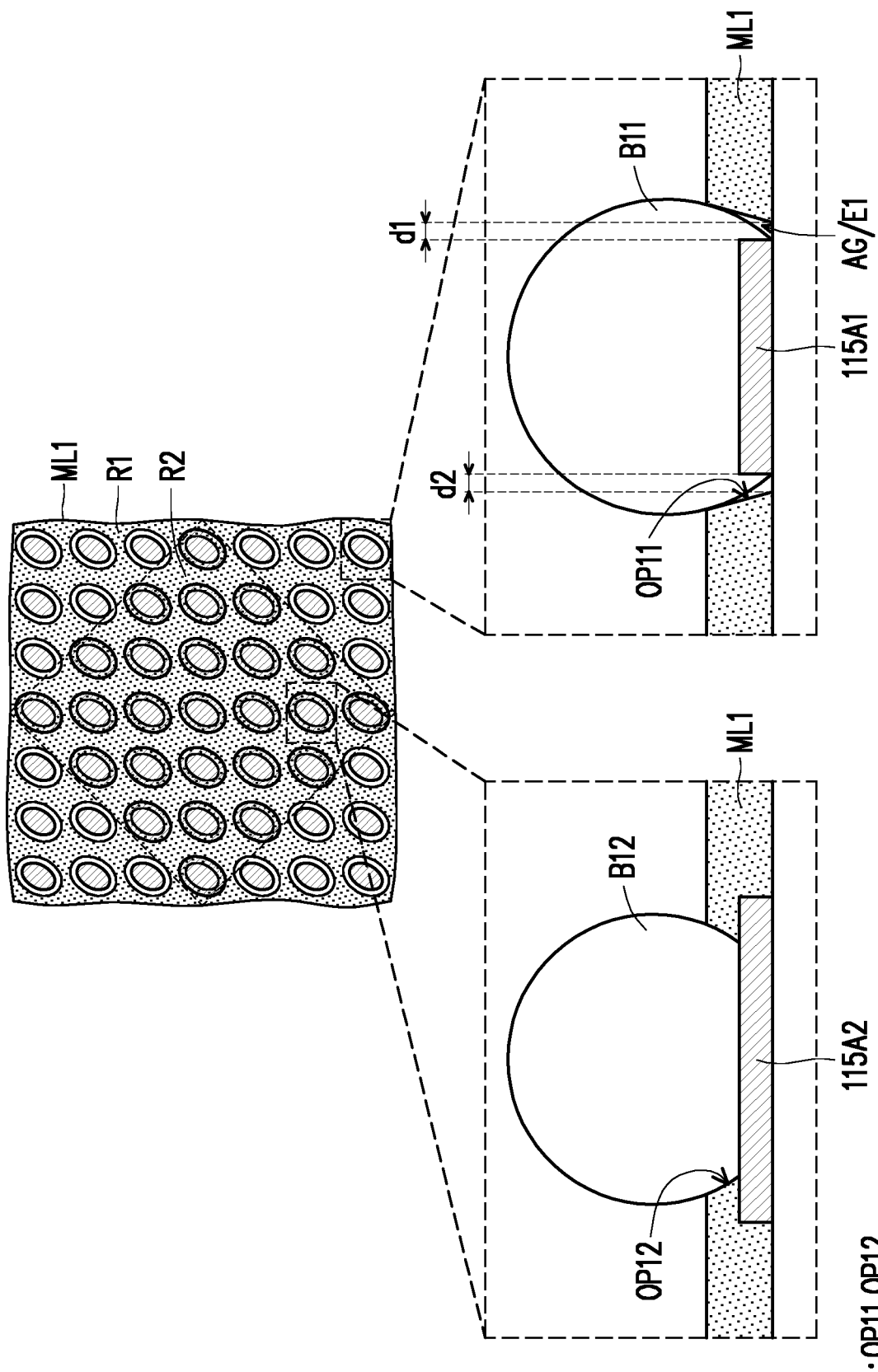
Figure 6:
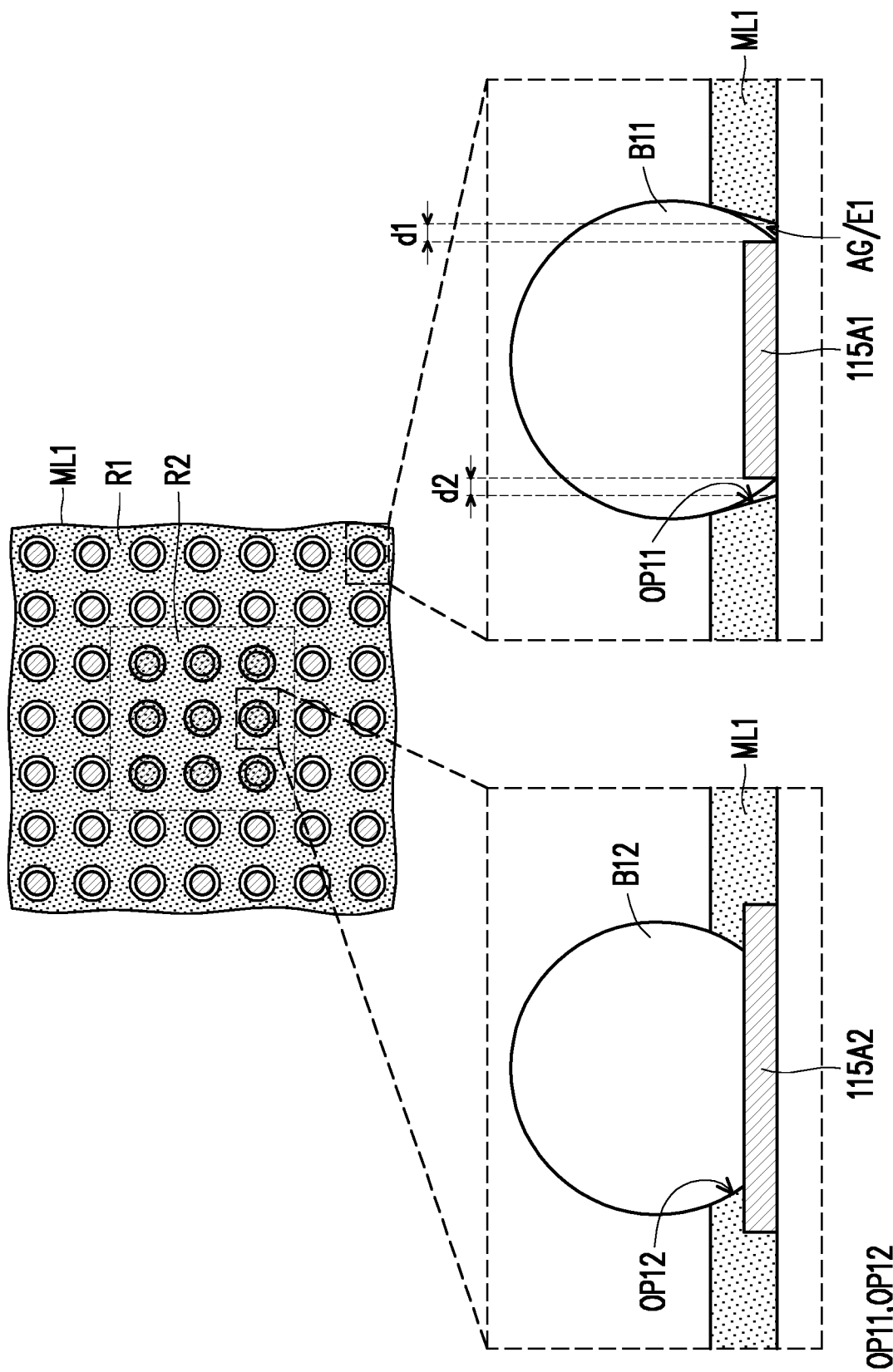
Figure 7:
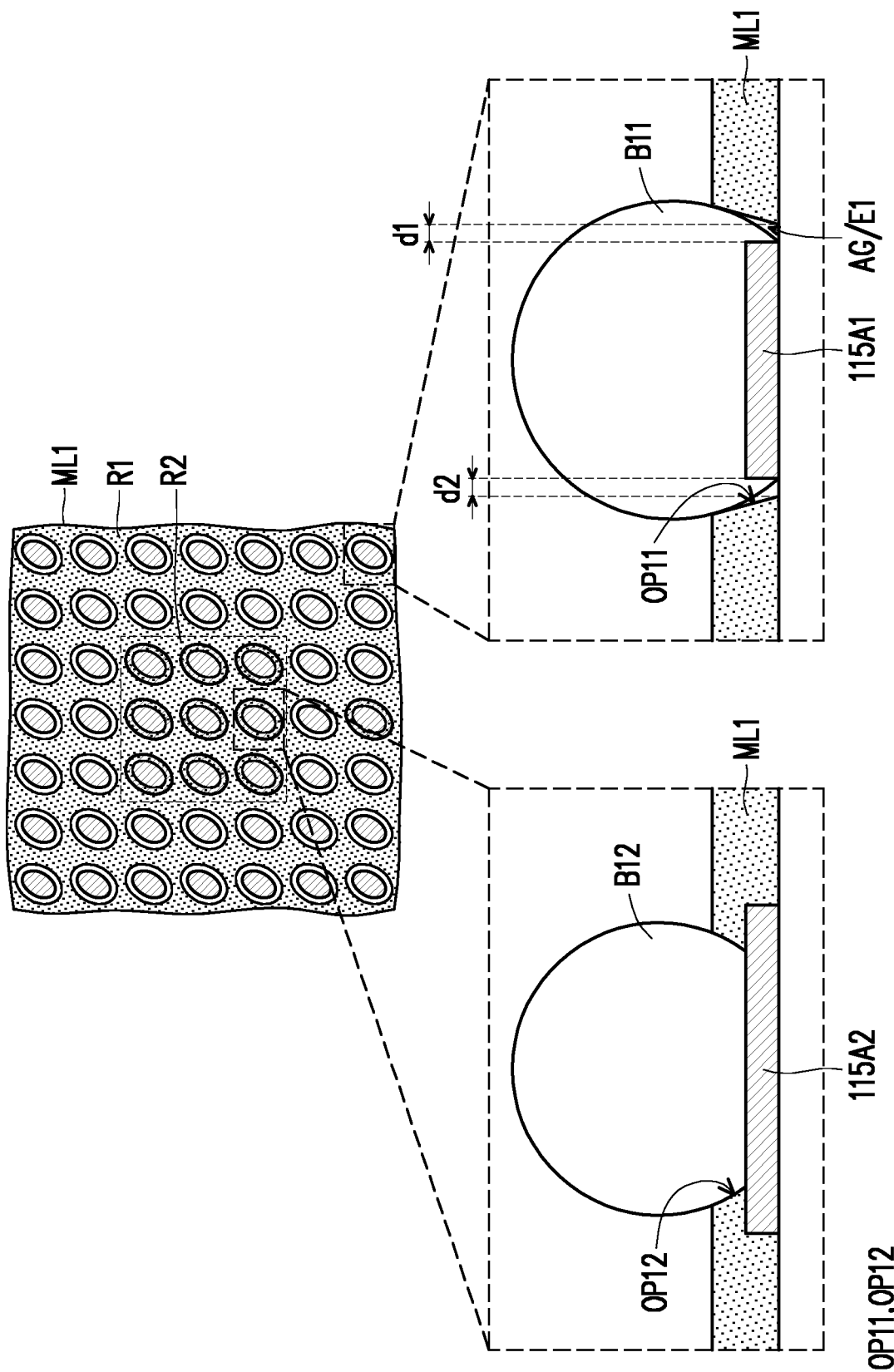

The element configuration of FIG. 3 is similar to the element configuration of FIG. 2, except that the shapes of the opening patterns OP1 and the first conductive patterns 115A are different. Specifically, the opening patterns OP1 and the first conductive patterns 115A in FIG. 2 have a circular shape, while the opening patterns OP1 and the first conductive patterns 115A in FIG. 3 have an oval shape.

In the above embodiments, the widened opening patterns of the first mask layer ML1 are distributed uniformly. However, the disclosure is not limited thereto. In other embodiments, the widened opening patterns of the first mask layer ML1 are not distributed uniformly. Accordingly, the widened opening patterns OP11 of the first mask layer ML1 may be designed differently to balance the edge or corner stress across the package region, as shown in FIG. 4 to FIG. 7.

As shown in FIG. 4 to FIG. 7, the opening patterns OP1 of the first mask layer ML1 includes opening patterns OP11 in a corner and/or edge package region R1 and opening patterns OP12 in a center package region R2. In some embodiments, the opening patterns OP11 are wider than the opening patterns OP12. As shown in FIG. 4 to FIG. 7, the first conductive patterns 115A includes first conductive patterns 115A1 in the corner and/or edge package region R1 and first conductive patterns 115A2 in the center package region R2. In some embodiments, the first conductive patterns 115A1 are smaller than the first conductive patterns 115A2.

In the embodiments of FIG. 4 to FIG. 7, each of the outermost first conductive patterns 115A1 in the corner and/or edge package region R1 is separated from the corresponding opening pattern OP11 of the first mask layer ML1, such that the subsequently formed bonding element B11 flows to cover the top and the sidewall of the outermost first conductive pattern 115A1. In some embodiments, air gaps AG (filled with air or the encapsulation layer E1) are present between at least some of the outermost first conductive patterns 115Al and the adjacent opening patterns OP11 of the first mask layer ML1. By such configuration, the solder joint area in the corner and/or edge package region is greatly increased, so the bonding stress is significantly reduced, and the conventional solder crack defects caused by high stress are not found.

On the other hand, each of the opening patterns OP12 of the first mask layer ML1 partially exposes the corresponding outermost first conductive pattern 115A2 in the center package region R2, such that the subsequently formed bonding element B12 merely covers the top of the outermost first conductive pattern 115A2.

In the embodiments of FIG. 4 to FIG. 7, the first conductive patterns 115A1/115A2 and the opening patterns OP11/OP12 of the first mask layer ML1 are designed differently for the edge and center package regions. However, the disclosure is not limited thereto.

In some embodiments, the dimension of the first conductive patterns 115A keeps the same across the whole package region, while the dimensions of the opening patterns of the first mask layer ML1 are designed differently for the edge and center package regions. For example, the opening patterns of the first mask layer ML1 are larger in the corner package region while the opening patterns of the first mask layer ML1 are smaller in the center package region.

In some embodiments, the dimension of the opening patterns of the first mask layer ML1 keeps the same across the whole package region, while the dimensions of the first conductive patterns 115A are designed differently for the edge and center package regions. For example, the first conductive patterns 115A are larger in the center package region while the first conductive patterns 115A are smaller in the edge package region.

The semiconductor packages of the disclosure and their modifications will be described below with reference to FIG. 1G to FIG. 7.

In some embodiments, a semiconductor package 10 includes a circuit board structure CBS, a first redistribution layer structure RDL and first bonding elements B1. The circuit board structure CBS includes outermost first conductive patterns 115A and a first mask layer ML1 adjacent to the outermost first conductive patterns 115A. The first redistribution layer structure RDL1 is disposed over the circuit board structure CBS. The first bonding elements B1 are disposed between and electrically connected to the first redistribution layer structure RDL1 and the outermost first conductive patterns 115A of the circuit board structure CBS. In some embodiments, at least one of the first bonding elements B1 covers a top and a sidewall of the corresponding outermost first conductive pattern 115A.

In some embodiments, from a top view, the opening patterns OP1 of the first mask layer ML1 are larger than the corresponding outermost first conductive patterns 115A, as shown in FIG. 2 and FIG. 3.

In some embodiments, from a top view, the opening patterns OP11 of the first mask layer ML1 are larger in the corner package region R1 while the opening patterns OP12 of the first mask layer ML1 are smaller in the center package region R2, as shown in FIG. 4 to FIG. 7.

In some embodiments, from a top view, the outermost first conductive patterns 115A2 are larger in the center package region R1 while the outermost first conductive patterns 115A1 are smaller in the edge package region R2, as shown in FIG. 4 to FIG. 7.

In some embodiments, the semiconductor package 10 further includes a package structure PKS disposed over and electrically connected to the first redistribution layer structure RDL1, and second bonding elements B2 disposed between and electrically connected to the first redistribution layer structure RDL1 and the package structure PKS. In some embodiments, the dimension of the first bonding elements B1 is larger than the dimension of the second bonding elements B2.

In some embodiments, the package structure PKS includes package components 128A, 128B. 128C and a second redistribution layer structure RDL2, and the second redistribution layer structure RDL2 is disposed between and electrically connected to the package components 128A, 128B, 128C and the second bonding elements B2.

In some embodiments, the semiconductor package 10 further includes third bonding elements B3 on a surface of the circuit board structure CBS opposite to a surface on which the first redistribution layer structure RDL1 is disposed, and the dimension of the third bonding elements B3 is larger than the dimension of the first bonding elements B1.

In some embodiments, an encapsulation layer E1 is disposed around the first bonding elements B1, and the sidewall of the encapsulation layer E1 is substantially flush with the sidewall of the first redistribution layer structure RDL1.

In some embodiments, a semiconductor package 10 includes a circuit board structure CBS, a package structure PKS and first bonding elements B1. The circuit board structure CBS includes outermost first conductive patterns 115A and a first mask layer ML1 located aside and separated from the outermost first conductive patterns 115A. In some embodiments, the outermost first conductive patterns 115A and the first mask layer ML1 face a first side S1 of an overlying first redistribution layer structure RDL1. The package structure PKS is disposed over a second side S2 opposite to the first side of the first redistribution layer structure RDL1. The first bonding elements B1 are disposed between and electrically connected to the first redistribution layer structure RDL1 and the outermost first conductive patterns 115A of the circuit board structure CBS.

In some embodiments, the first bonding elements B1 cover tops and sidewalls of the outermost first conductive patterns 115A, respectively, as shown in FIG. 2 to FIG. 3.

In some embodiments, an air gap AG is between at least one of the first opening patterns OP1 of the first mask layer ML1 and the adjacent first bonding element B1.

In some embodiments, an encapsulation layer E1 is disposed around the first bonding elements B1 and fills in the air gaps AG.

In some embodiments, the outermost first conductive patterns 115A have a circular shape or an oval shape from a top view.

In some embodiments, the package structure PKS includes package components 128A, 128B, 128C and a second redistribution layer structure RDL2, and the second redistribution layer structure RDL2 is disposed between and electrically connected to the package components 128A, 128B, 128C and the first redistribution layer structure RDL1. In some embodiments, the critical dimension of the second redistribution layer structure RDL2 is smaller than the critical dimension of the first redistribution layer structure RDL1.

Figure 8:
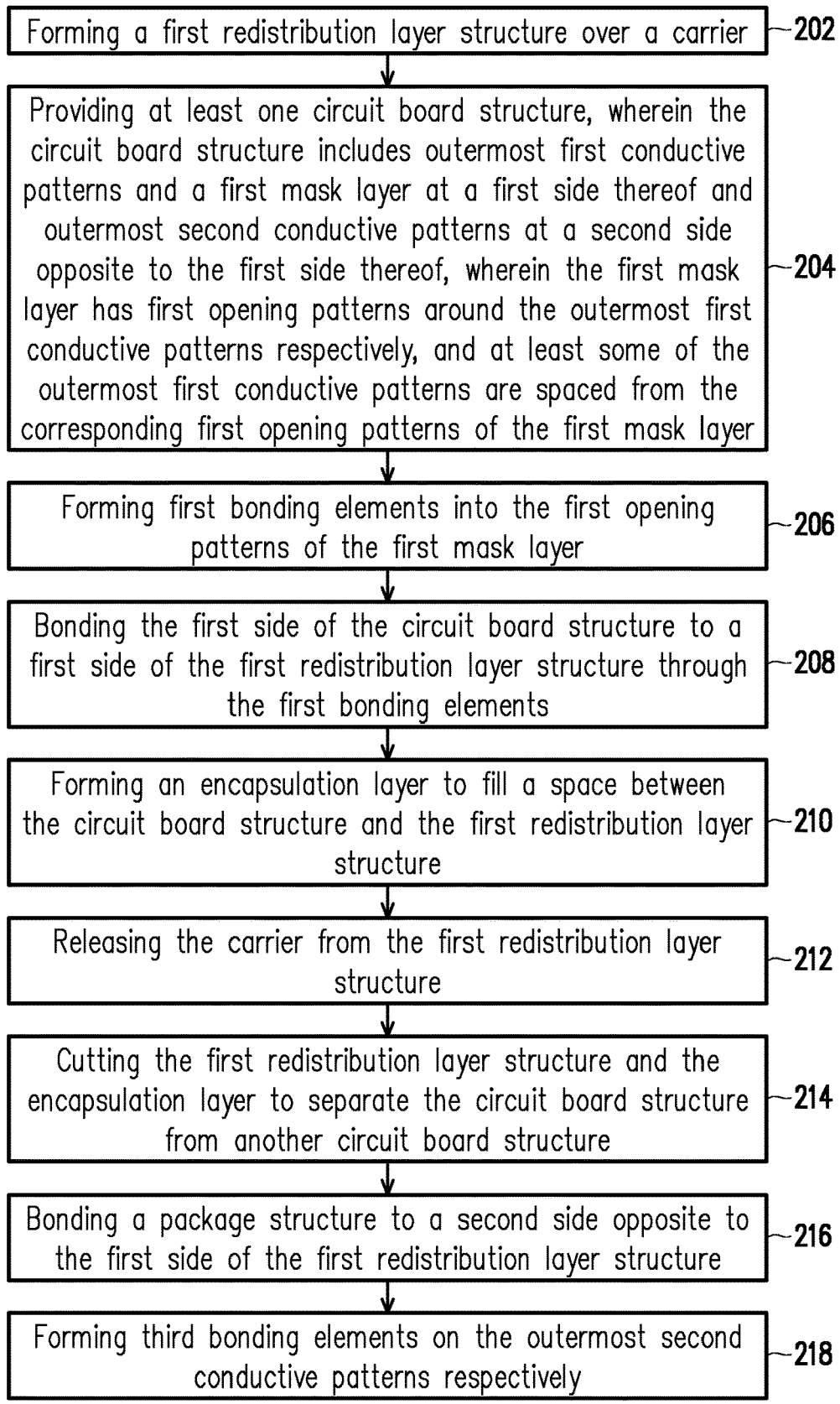
FIG. 8 illustrates a method of forming a semiconductor package in accordance with some embodiments.

FIG. 8 illustrates a method of forming a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 202, a first redistribution layer structure is formed over a carrier. FIG. 1A illustrates a cross-sectional view corresponding to some embodiments of act 202.

At act 204, at least one circuit board structure is provided, wherein the circuit board structure includes outermost first conductive patterns and a first mask layer at a first side thereof and outermost second conductive patterns at a second side opposite to the first side thereof, wherein the first mask layer has first opening patterns around the outermost first conductive patterns respectively, and at least some of the outermost first conductive patterns are separated from the corresponding first opening patterns of the first mask layer. FIG. 1B illustrates a cross-sectional view corresponding to some embodiments of act 204.

At act 206, first bonding elements are formed into the first opening patterns of the first mask layer. In some embodiments, the first bonding elements cover sidewalls and tops of at least some of the outermost first conductive patterns after forming the first bonding elements. In some embodiments, air gaps are formed between at least some of the outermost first conductive patterns and the adjacent first opening patterns of the first mask layer after forming the first bonding elements. FIG. 1B illustrates a cross-sectional view corresponding to some embodiments of act 206. FIG. 2 to FIG. 7 illustrate simplified top views and localized cross-sectional views corresponding to some embodiments of act 206.

At act 208, the first side of the circuit board structure is bonded to a first side of the first redistribution layer structure through the first bonding elements. FIG. 1C illustrates a cross-sectional view corresponding to some embodiments of act 208.

At act 210, an encapsulation layer is formed to fill a space between the circuit board structure and the first redistribution layer structure. FIG. 1C illustrates a cross-sectional view corresponding to some embodiments of act 210.

At act 212, the carrier is released from the first redistribution layer structure. FIG. 1D illustrates a cross-sectional view corresponding to some embodiments of act 212.

At act 214, the first redistribution layer structure and the encapsulation layer are cut to separate the circuit board structure from another circuit board structure. FIG. 1E illustrates a cross-sectional view corresponding to some embodiments of act 214.

At act 216, a package structure is bonded to a second side opposite to the first side of the first redistribution layer structure. FIG. 1F illustrates a cross-sectional view corresponding to some embodiments of act 216.

At act 218, third bonding elements are formed on the outermost second conductive patterns respectively. FIG. 1G illustrates a cross-sectional view corresponding to some embodiments of act 218.

In some embodiments, the substrate for the package structure includes the semi-finished circuit substrate and the redistribution layer structure. In other words, compared with the conventional circuit board made of the core layer and the build-up layers, the substrate for the package structure further includes the redistribution layer structure, which replaces parts of the build-up layers. In some embodiments, the redistribution layer structure of the substrate may be fabricated by an InFO process in an environment such as standard silicon fabrication environment. Therefore, the substrate may be fabricated with a high yield, and the substrate may have high modulus, reduced thickness, low roughness, and/or good electrical performance. Accordingly, rigidity, inductance and/or resistance of the whole semiconductor package is enhanced and cost is reduced. In addition, the process of the semiconductor package is suitable for system on integrated substrate (SoIS) and system on wafer (SoW), and meets the requirements for high performance computing structures. Besides, with the specific design of the disclosure, the solder joint area of the bonding features between the redistribution layer structure and the circuit board structure is greatly increased, the bonding stress is significantly reduced, and solder crack defects caused by high stress (specifically in corner and/or edge package regions) are not found.

Many variations of the above examples are contemplated by the present disclosure. It is understood that different embodiments may have different advantages, and that no particular advantage is necessarily required of all embodiments.

In accordance with some embodiments of the present disclosure, a semiconductor package includes a circuit board structure, a first redistribution layer structure and first bonding elements. The circuit board structure includes outermost first conductive patterns and a first mask layer adjacent to the outermost first conductive patterns. The first redistribution layer structure is disposed over the circuit board structure. The first bonding elements are disposed between and electrically connected to the first redistribution layer structure and the outermost first conductive patterns of the circuit board structure. In some embodiments, at least one of the first bonding elements covers a top and a sidewall of the corresponding outermost first conductive pattern.

In accordance with alternative embodiments of the present disclosure, a semiconductor package includes a circuit board structure, a package structure and first bonding elements. The circuit board structure includes outermost first conductive patterns and a first mask layer located aside and separated from the outermost first conductive patterns. In some embodiments, the outermost first conductive patterns and the first mask layer face a first side of an overlying first redistribution layer structure. The package structure is disposed over a second side opposite to the first side of the first redistribution layer structure. The first bonding elements are disposed between and electrically connected to the first redistribution layer structure and the outermost first conductive patterns of the circuit board structure.

In accordance with yet alternative embodiments of the present disclosure, a method of manufacturing a semiconductor package includes the following operations. A first redistribution layer structure is formed over a carrier. A circuit board structure is provided, wherein the circuit board structure includes outermost first conductive patterns and a first mask layer at a first side thereof and outermost second conductive patterns at a second side opposite to the first side thereof, wherein the first mask layer has first opening patterns around the outermost first conductive patterns respectively, and at least some of the outermost first conductive patterns are spaced from the corresponding first opening patterns of the first mask layer. First bonding elements are formed into the first opening patterns of the first mask layer. The first side of the circuit board structure is bonded to a first side of the first redistribution layer structure through the first bonding elements. An encapsulation layer is formed to fill a space between the circuit board structure and the first redistribution layer structure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a circuit board structure, comprising:
a core layer and first and second build-up layers respectively located on two surfaces of the core layer; and first conductive patterns located on the first build-up layer;

a first redistribution layer structure disposed over the circuit board structure; and first bonding elements disposed on the first conductive patterns and located between and electrically connected to the first redistribution layer structure and the circuit board structure, wherein a portion of an encapsulation layer is disposed between the first redistribution layer structure and the circuit board structure and another portion of the encapsulation layer covers a sidewall of the circuit board structure, and wherein a sidewall of the first redistribution layer structure is flush with a sidewall of the encapsulation layer.

2. The semiconductor package according to claim 1, wherein the first conductive patterns comprise inner conductive patterns and outer conductive patterns around the inner conductive patterns, the first bonding elements comprise inner bonding elements disposed on the inner conductive patterns and outer bonding elements disposed on the outer conductive patterns, and wherein the outer bonding elements completely cover top surfaces and sidewalls of the outer conductive patterns, and the inner bonding elements partially cover top surfaces of the inner conductive patterns.

3. The semiconductor package according to claim 2, wherein a width of the outer conductive patterns is less than a width of the inner conductive patterns.

4. The semiconductor package according to claim 2, wherein tops of the outer bonding elements are flush with tops of the inner bonding elements.

5. The semiconductor package according to claim 1, further comprising a first mask layer adjacent to the first conductive patterns and in contact with the first build-up layer, wherein from a top view, outer opening patterns of the first mask layer are larger than inner opening patterns of the first mask layer.

6. The semiconductor package according to claim 1, further comprising:

a package structure, disposed over and electrically connected to the first redistribution layer structure; and second bonding elements, disposed between and electrically connected to the first redistribution layer structure and the package structure.

7. The semiconductor package according to claim 6, wherein a dimension of the first bonding elements is larger than a dimension of the second bonding elements.

8. The semiconductor package according to claim 6, wherein the package structure comprises package components and a second redistribution layer structure, and the second redistribution layer structure is disposed between and electrically connected to the package components and the second bonding elements.

9. The semiconductor package according to claim 1, wherein from a top view, each of the outer conductive patterns and the inner conductive patterns has an oval shape with a long axis towards the same direction, and the long axis of the oval shape is inclined with respect to an edge of the circuit board structure.

10. A semiconductor package, comprising:

a circuit board structure, comprising:

first conductive patterns located on a surface of the circuit board structure; and a first mask layer located on the surface of the circuit board structure and aside the first conductive patterns;

a first redistribution layer structure, disposed over the circuit board structure;

first bonding elements bonded to the first conductive patterns and disposed between and electrically connected to the first redistribution layer structure and the circuit board structure, wherein an encapsulation layer is disposed between the first redistribution layer structure and the circuit board structure and located within at least some gaps between the first bonding elements and the first mask layer.

11. The semiconductor package according to claim 10, wherein dimensions of the first conductive patterns are substantially the same across the circuit board structure.

12. The semiconductor package according to claim 10, wherein dimensions of the first conductive patterns are varied across the circuit board structure.

13. The semiconductor package according to claim 12, wherein the first conductive patterns comprise inner conductive patterns and outer conductive patterns surrounding the inner conductive patterns, and a dimension of the inner conductive patterns is less than a dimension of the outer conductive patterns.

14. The semiconductor package according to claim 10, wherein from a top view, each of the first conductive patterns has an circular shape.

15. The semiconductor package according to claim 10, wherein from a top view, each of the first conductive patterns has an oval shape with a long axis towards the same direction.

16. A method of manufacturing a semiconductor package, comprising:

providing a circuit board structure, wherein the circuit board substrate comprises: a core layer and first and second build-up layers respectively located on two surfaces of the core layer; and-first conductive patterns located on the first build-up layer;

forming a first redistribution layer structure over the circuit board structure;

forming first bonding elements, wherein the first bonding elements are disposed on the first conductive patterns and located between and electrically connected to the first redistribution layer structure and the circuit board structure; and forming an encapsulation layer, wherein a portion of the encapsulation layer is disposed between the first redistribution layer structure and the circuit board structure and another portion of the encapsulation layer covers a sidewall of the circuit board structure, and cutting the first redistribution layer structure and the encapsulation layer, so that a sidewall of the first redistribution layer structure is flush with a sidewall of the encapsulation layer after the cutting process.

17. The method according to claim 16, wherein the first bonding elements cover sidewalls and tops of at least some of the outermost first conductive patterns after forming the first bonding elements.

18. The method according to claim 16, wherein air gaps are formed between at least some of the outermost first conductive patterns and the adjacent first opening patterns of the first mask layer after forming the first bonding elements.

19. The method according to claim 16, wherein the encapsulation layer is further formed between at least some of the outermost first conductive patterns and the adjacent first opening patterns of the first mask layer.

20. The method according to claim 16, further comprising:
   bonding a package structure to the first redistribution layer structure opposite to the circuit board structure.

\* \* \* \* \*